US006404027B1

(12) United States Patent
Hong et al.

(10) Patent No.: US 6,404,027 B1
(45) Date of Patent: Jun. 11, 2002

(54) HIGH DIELECTRIC CONSTANT GATE OXIDES FOR SILICON-BASED DEVICES

(75) Inventors: Minghwei Hong, Watchung; Ahmet Refik Kortan, Warren; Jueinai Raynien Kwo, Watchung; Joseph Petrus Mannaerts, Summit, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/499,411

(22) Filed: Feb. 7, 2000

(51) Int. Cl.$^7$ .............................................. H01L 29/76
(52) U.S. Cl. ...................... 257/410; 257/506; 257/527; 257/623; 257/627; 257/632; 438/207
(58) Field of Search ............................... 257/410, 506, 257/527, 623, 627, 632; 438/207, 218, 294, 427, 958

(56) References Cited

U.S. PATENT DOCUMENTS

| | | | | |
|---|---|---|---|---|
| 3,663,870 A | * | 5/1972 | Tsutsumi et al. | 317/235 R |
| 4,707,216 A | * | 11/1987 | Morkoc et al. | 156/610 |
| 4,872,046 A | | 10/1989 | Morkoc et al. | |
| 5,736,240 A | * | 4/1998 | Hintz | 428/332 |
| 5,908,312 A | | 6/1999 | Cheung et al. | |
| 6,045,626 A | * | 4/2000 | Yano et al. | 148/33 |

FOREIGN PATENT DOCUMENTS

| | | | | |
|---|---|---|---|---|
| JP | 6210757 A | * | 7/1987 | 257/729 |
| JP | 63140577 A | * | 6/1988 | 257/410 |

OTHER PUBLICATIONS

McKee, R.A., Walker, F.J., M.F. Chisholm, "Crystalline Oxides on Silicon: The First Five Monolayers" Physical Review Letters vol. 81, No. 14, Oct. 5, 1998.

S.A. Campbell, D.C. Gilmer, H.S. Kim, M.A. Gribelyuk, G.D. Wilk W.L. Gladfelter, "Composite $SiO_2TiO_2$ Gate Insulator Stacks Formed From Tetranitrato Titanium" Election Dev. p. 104 1997.

S.C. Choi, M.H. CHO, S.W. Whangtoo, C.N. Whang, Dept. of Physics, Yonsei University, Seoul 120–749, Korea; S.B. Kang, S.I. Lee, M.Y. Lee Semiconductor Research Center, Samsung Electronics Co. Ltd. Suwon 440–600, Korea.

Keizo Harada, Hidenori Nakanishi, Hideo Itozaki, Shuji Yazu, "Growth of Buffer Layers on Si Substrate for High–Tc Superconducting Thin Films" Japanese Journal of Applied Physics, vol. 30, No. 5, May 1991, pp. 934–938.

Hirofumi Fukumoto, Takeshi Imura, Yukio Osaka, "Heteroepitaxial Growth of $Y_2O_3$ films on Silicon" Applied Phys. Letter ss(4) Jul. 24, 1999.

M. Gurvitch, L.Manchanda, J.M. Gibson, "Study of thermally Oxidized Yttrium films on Silicon" Applied Physics Lett. 51(12) Sep. 21, 1987.

Z. Yu, J. Ramdani, J.A. Curless, J.M. Finder, C.D. Overgaard, R. Droopad, K.W. Eisenbeiser, J.A. Hallmark, W.J. OOMS (Physical Sciences Research Laboratories—Motorola Labs) J.R. Conner, V.S. Kaushik(Motorola Digital DNA Labs) "Epitaxial Perovskite thin films grown on silicon by molecular beam epitaxy" MBE Conference, Banff, Canada October 10, 1999.

* cited by examiner

Primary Examiner—Eddie Lee
Assistant Examiner—Matthew E. Warren
(74) Attorney, Agent, or Firm—Wendy W. Koba

(57) ABSTRACT

A high dielectric rare earth oxide of the form $Mn_2O_3$ (such as, for example, $Gd_2O_3$ or $Y_2O_3$) is grown on a clean silicon (100) substrate surface under an oxygen partial pressure less than or equal to $10^{-7}$ torr to form an acceptable gate oxide (in terms of dielectric constant ($\in$~18) and thickness) that eliminates the tunneling current present in ultra-thin conventional $SiO_2$ dielectrics and avoids the formation of a native oxide layer at the interface between the silicon substrate and the dielectric. Epitaxial films can be grown on vicinal silicon substrates and amorphous films on regular silicon substrates to form the high dielectric gate oxide.

15 Claims, 6 Drawing Sheets

KEY:
- ■ SINGLE DOMAIN 196 Å
- ● SINGLE DOMAIN 125 Å
- ◇ SINGLE DOMAIN 34 Å, GAS ANNEAL
- ▲ SINGLE DOMAIN 34 Å
- □ 2 DOMAIN 170 Å
- ○ 2 DOMAIN 44 Å

HIGH DIELECTRIC CONSTANT GATE OXIDES FOR SILICON-BASED DEVICES

TECHNICAL FIELD

The present invention relates to an improved gate oxide material, and method of forming the same, for silicon-based devices and, more particularly, to the use of rare earth oxides, such as $Gd_2O_3$ or $Y_2O_3$ (exhibiting a dielectric constant $\in$ on the order of 18) to form a gate oxide having the desired insulative properties while maintaining a thickness greater than the tunneling depth of approximately 10 Å.

BACKGROUND OF THE INVENTION

As integrated circuit technology advances, the gate lengths of MOSFETs become increasingly smaller. In addition, the thicknesses of the gate dielectrics, typically gate oxides, become thinner and thinner. Very thin gate oxides (i.e., less than 50 Å) are often necessary for sub-micron MOS devices.

As device dimensions scale down rapidly with the advance of technology, the electric field in the thin gate oxides continues to increase. Part of the consequences of such increased electric field is the increased trap generation at the oxide interface or within the thin oxides. The trap generation and the capture of channel electrons by the traps in turn leads to increased low frequency (1/f) noise and transconductance ($g_m$) degradation. For ultra-thin gate oxides of less than 50 Å, the tunneling current also becomes significant and gives rise to accelerated degradation of the device characteristics. Indeed, the "thinness" of the conventional $SiO_2$ gate oxide is now approaching the quantum tunneling limit of 10 Å.

Instead of continuously attempting to reduce the $SiO_2$ thickness of the gate oxide, several groups have attempted to find a replacement insulator with a dielectric constant ($\in$) substantially greater than that of $SiO_2$ ($\in=3.9$), so that the dielectric thickness can then be proportionally increased (thereby reducing the chance of a tunneling current through the oxide). It is desirable that the dielectric being thermodynamically stable with respect to the silicon surface so as to prevent reactions leading to the formation of $SiO_2$ or metal silicides at the substrate/dielectric interface during high temperature annealing operations. To date, several "high dielectric" oxides have been considered (such as $Al_2O_3$, $Ta_2O_3$, $TiO_2$), but in each case an interfacial $SiO_2$ layer at least 10 Å thick forms during growth of the gate oxide. An alternative approach uses a relatively thin $SiN_y$ barrier layer that is first deposited on the silicon surface to prevent the native oxide growth. However, the use of the barrier layer then requires for the total "effective" oxide thickness to exceed 15 Å, another unacceptable result.

Thus, a need remains in the art for a dielectric material to be used as a "thin" gate dielectric on silicon-based devices that prevents the formation of the native $SiO_2$ layer, yet also exhibits an effective thickness closer to 10 Å.

SUMMARY OF THE INVENTION

The need remaining in the prior art is addressed by the present invention, which relates to an improved gate oxide material, and method of forming the same, for silicon-based devices and, more particularly, to the use of rare earth oxides, such as $Gd_2O_3$ or $Y_2O_3$ (exhibiting a dielectric constant $\in$ significantly greater than that of $SiO_2$ (approximately 4), for example, on the order of 18) to form a gate oxide having the desired insulative properties while maintaining a thickness greater than the tunneling depth of approximately 10 Å.

Films of $Gd_2O_3$ or $Y_2O_3$ are grown, in accordance with the present invention, on a "clean" silicon substrate surface, using an ultrahigh vacuum (UHV) vapor deposition process. It has been found that by limiting the oxygen partial pressure to less than $10^{-7}$ during growth, oxidation of the silicon substrate surface is completely avoided. Both epitaxial and amorphous films have been found to form an oxide with the desired high dielectric constant characteristic.

In accordance with the present invention, a vicinal Si(100) substrate is preferably used, so as to promote the formation of single domain, (110)-oriented $Gd_2O_3$ or $Y_2O_3$ films. In a preferred embodiment a 4° miscut substrate may be used.

A post-process gas anneal process may also be used to improve the leakage current density from a value of, for example, $10^{-1}$ A/cm² to $10^{-5}$ A/cm² at 1V for a $Gd_2O_3$ layer at an equivalent $SiO_2$ thickness of 19 Å.

Other and further aspects of the present invention will become apparent during the following discussion and by reference to the accompanying drawings.

BRIEF DESCRIPTION OF THE DRAWINGS

Referring now to the drawings.

DETAILED DESCRIPTION

Rare earth oxides are suitable candidates for various semiconductor applications, based on thermodynamic energy considerations. In accordance with the present invention, it has been found possible to form the dielectrics $Gd_2O_3$ ($\in\sim 12$) or $Y_2O_3$ ($\in\sim 18$) as gate oxides on a silicon (100) surface. Both materials exhibit the required "high" dielectric when compared to that of $SiO_2$ ($\in=3.9$), although $Y_2O_3$ is considered to be preferred due to its higher dielectric constant and the absence of magnetic ions in the oxide.

Figure 1:
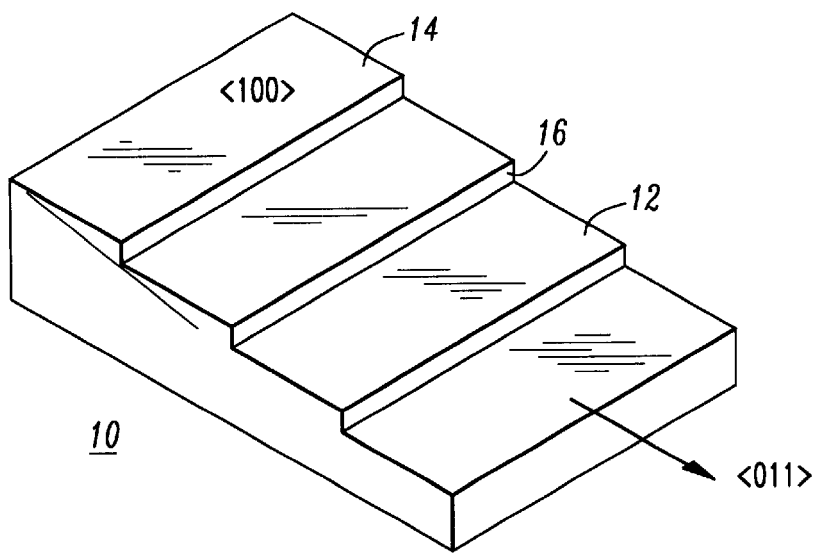
FIG. 1 illustrates an exemplary vicinal silicon substrate that is preferable for supporting growth of a high dielectric gate oxide of the present invention.

An important aspect of the present invention is the use of vicinal Si(100) substrates to eliminate the formation of unwanted domains in the grown oxides, thus providing a single domain, (110)-oriented gate oxide. FIG. 1 illustrates an exemplary vicinal Si(100) substrate 10, which has been "miscut" at a predetermined tilt angle, where a tilt angle in the range of 4–6° has been found to be preferable. The miscut surface 12 exposes surface steps 14 of double atomic layers, thus giving mono-domain silicon terraces of a spacing approximately 80 Å (for a 4.20 miscut) for nucleating the growth of a single variant of either $Gd_2O_3$ or $Y_2O_3$.

In forming the high dielectric gate oxide structure of the present invention, a multi-chamber ultra-high vacuum system may be used. Prior to growing the dielectric, the silicon wafer is cleaned and then hydrogen passivated (using a buffered HF acid, for example) to form a surface free of impurities. The substrate is then heated to a temperature in the range of, for example, 450–500° C., allowing the generation of a silicon surface free of impurities or oxides. Powder-packed ceramic sources of $Gd_2O_3$ or $Y_2O_3$ are then used as electron beam sources in the UHV system to provide deposition of the desired epitaxial dielectric film. In accordance with one aspect of the present invention, the oxygen partial pressure within the UHV chamber needs to be maintained at less than $10^{-7}$ torr during growth, where such a pressure has been found to essentially eliminate the formation of a native $SiO_2$ layer at the interface between the substrate and dielectric. As mentioned above, the capability of controlling the structure and chemistry of the interface at the atomic layer scale is critical.

The presence/lack of such a native oxide film has been studied by carrying out an infrared absorption analysis of $Gd_2O_3$ oxide films and the associated interface with the underlying silicon substrate. To maintain the integrity of the $Gd_2O_3$ film during the analysis, a thin amorphous silicon film was deposited in-situ on the $Gd_2O_3$ film prior to atmosphere exposure. The presence of this silicon film made it possible to HF-etch both the amorphous front and crystalline back silicon surfaces, leaving them H-terminated and insuring only an interface native oxide would contribute to an IR absorption spectrum. For comparison, each wafer containing a $Gd_2O_3$ dielectric film was reference to a similarly HF-etched silicon substrate—without a $Gd_2O_3$ film deposition. The absorption results clearly show a $Gd_2O_3$ phonon band at 600 cm$^{-1}$, where its intensity scales with film thickness. There was a lack of any measurable $SiO_2$-related features at either the TO (1050 cm$^{-1}$) or LO (1200–1250 cm$^{-1}$) frequencies of $SiO_2$, for crystalline as well as amorphous $Gd_2O_3$ samples.

Crystals of $Gd_2O_3$ and $Y_2O_3$ have an isomorphic $Mn_2O_3$ structure with a large lattice constant (10.81 Å and 10.60 Å, respectively). Studies have shown that an (110)-oriented $Gd_2O_3$ and $Y_2O_3$ of two-fold symmetry will grow on a conventional (100) silicon surface of four-fold symmetry, leading to the unwanted formation of two (110) variants of equal probability in the growth plane. In particular, the growth of these two variants with equal probability results in an oxide with a relatively high leakage current, and is clearly not favorable for device consideration. In accordance with the present invention, the two-fold degeneracy is removed by using the vicinal silicon substrate, as illustrated in FIG. 1.

Post-growth processing may also be employed in the method of the present invention, where as will be discussed in more detail below, a post-forming gas anneal has been shown to provide an improvement in leakage current density from 10 A/cm$^2$ to $10^{-5}$ A/cm$^2$ at 1V for a $Gd_2O_3$ layer at an equivalent $SiO_2$ thickness of 19 Å. An amorphous $Y_2O_3$ film can be formed on a conventional silicon surface that exhibits a leakage current as low as $10^{-6}$ A/cm$^2$ at 1V for an $SiO_2$ equivalent thickness of 10 ÅA.

Figure 2:
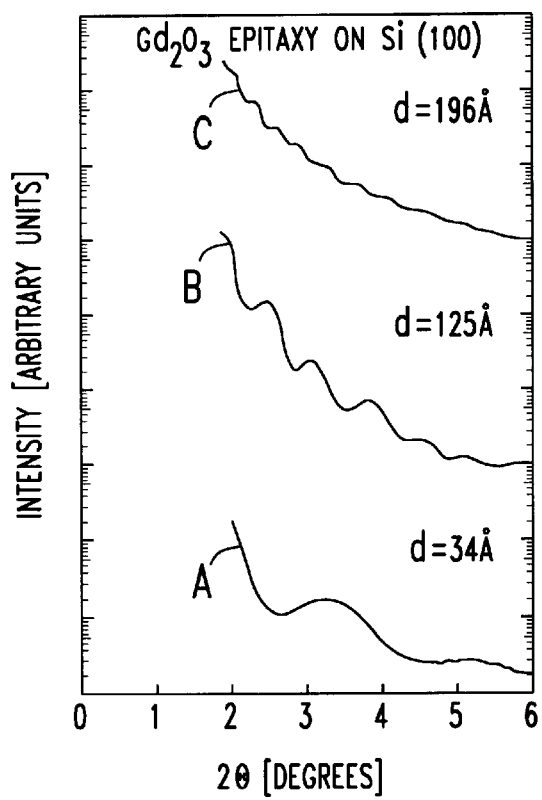
FIG. 2 contains a graph of an X-ray diffraction scan across a set of three different (110) $Gd_2O_3$ single domain films.

FIG. 2 illustrates a longitudinal x-ray diffraction scan along the surface of three different $Gd_2O_3$ films. Scan A of FIG. 2 is associated with a $Gd_2O_3$ film of thickness 34 Å, scan B with a $Gd_2O_3$ film of thickness 125 Å, and scan C with a $Gd_2O_3$ film having a thickness of 196 Å. Referring to FIG. 2, the fringe patterns on each scan can be attributed to coherent interference between the air/oxide and oxide/silicon interfaces. While the fringe period is inversely proportional to the film thickness, the decay of the fringe amplitude is a measure of the film thickness uniformity. Thus, the slow decay as shown in each scan leads to the conclusion that each of the grown $Gd_2O_3$ films is extremely uniform. The various oxide thicknesses discussed with respect to FIG. 2 (as well as the following figures) are considered to be exemplary only. In general, high dielectric oxides formed in accordance with the present invention may comprise a thickness anywhere within the range of, for example 10–500 Å and provide the desired gate dielectric properties for all intended device applications.

Figure 3:
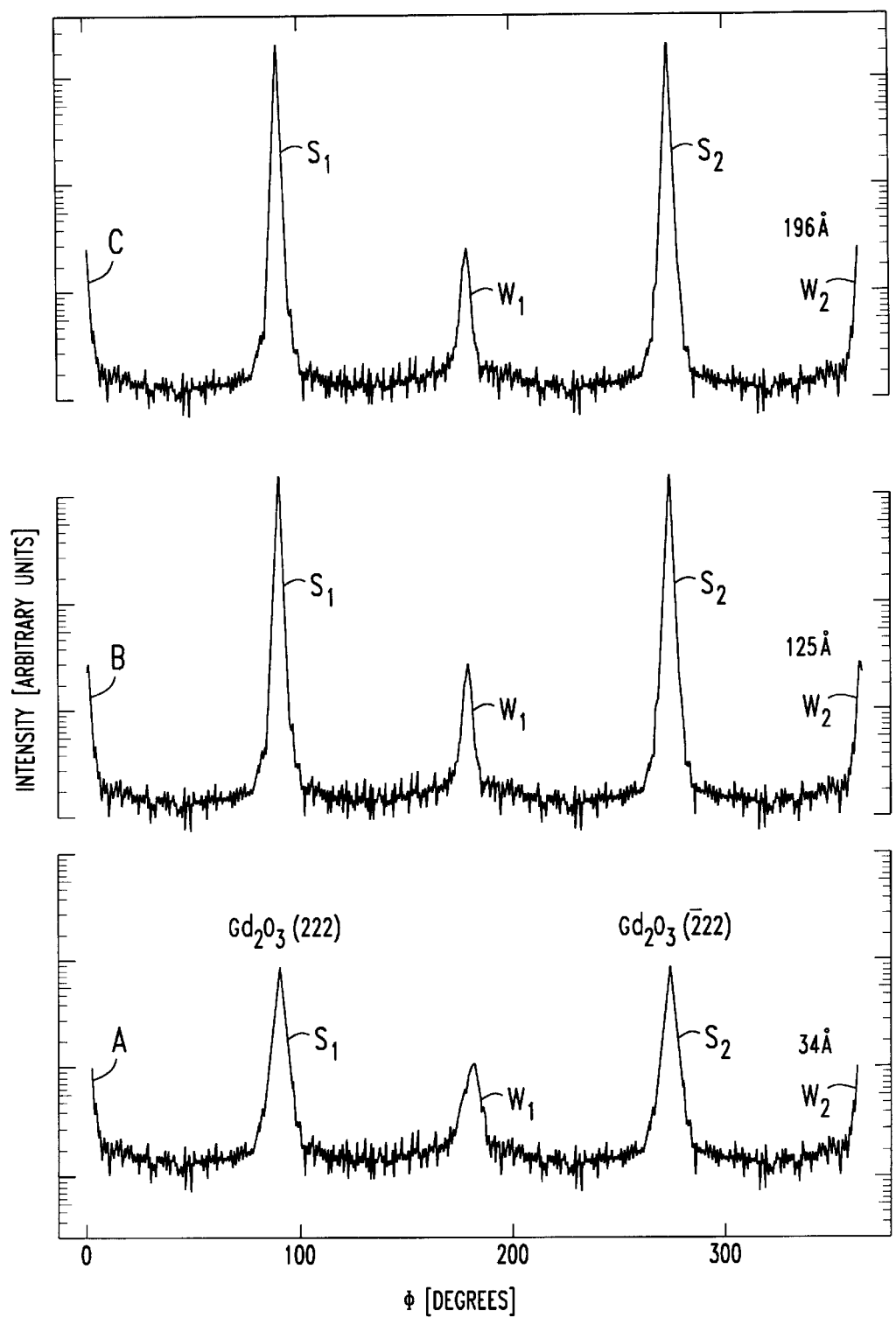
FIG. 3 shows the {222} reflections resulting from both degenerate orientations of $Gd_2O_3$ films, illustrating the relationship between film thickness and domination of a preferred orientation.

$Gd_2O_3$ gate dielectric films grown on vicinal (100) silicon substrates in accordance with the present invention have been found to exhibit a broad peak near 2θ=47.5° for the (440) reflection, with the peak becoming sharper with increasing film thickness. FIG. 3 illustrates in particular a set of 360° φ scan about the surface normal for the in-plane components of the {222} reflection for the set of three different $Gd_2O_3$ films associated with FIG. 2. In each case, the grown dielectric is predominantly oriented in one type of domain, with the [001] axis of the $Gd_2O_3$ parallel to the silicon step edges 16 (see FIG. 1), that is, the [110] axis of miscut substrate 10. The {222} reflections illustrated in FIG. 3 for each dielectric thickness illustrate peaks associated with both orientations. The two weak peaks, denoted $w_1$, and $w_2$ in FIG. 3, are separated by π with respect to the two strong peaks, denoted $s_1$ and $S_2$. An analysis of the data in FIG. 3 yields the conclusion that nearly 95% of the 34 Å thick $Gd_2O_3$ dielectric is grown in the preferred ("strong") orientation, with the percentage increasing to approximately 99% for the thicker 196 Å film. The analysis leads to the conclusion that beyond some "critical" thickness (approximately 100 Å), domains with the undesired orientation begin to get buried beneath the still-growing oxide.

Figure 4:
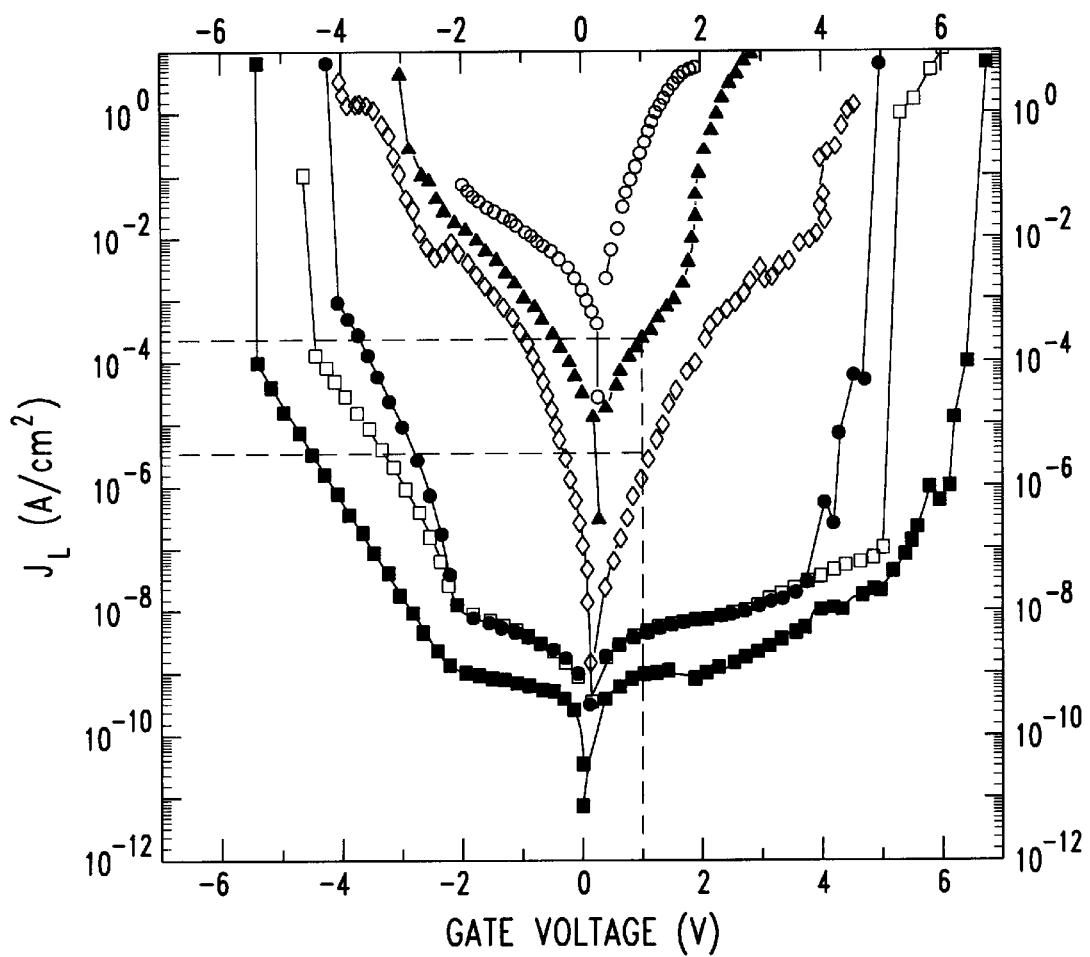
FIG. 4 contains a graph of leakage current density ($J_L$) versus voltage (V) for crystalline $Gd_2O_3$ films.

FIG. 4 is a plot of leakage current density, $J_L$, as a function of gate voltage, for various $Gd_2O_3$ dielectric layers under various conditions. Both two-domain and single domain films are represented, and also included in FIG. 4 is plot of leakage current/gate voltage for a single-domain 34 Å thick $Gd_2O_3$ film subsequent to a post-forming gas anneal at a temperature of 400° C. for one hour (labeled as "D" in FIG. 4). Referring to FIG. 4, it is apparent that the leakage current density is essentially symmetric about an unbiased gate (i.e., a 0V applied voltage). The leakage current density of two-domain dielectric films is shown to be significantly higher than that associated with single domain films, particularly for dielectrics thinner than 100 Å. As shown, the leakage current density for a two-domain film 44 Å thick can be as high as $10^{-3}$ A/cm$^2$ at zero bias. The leakage current density of the single domain dielectrics is markedly improved, particularly at smaller film thicknesses. For example, $J_L$ at 1V for a 34 Å thick film is reduced from a value of approximately $\geq 10^{-1}$ A/cm$^2$ for a two-domain film to a value of about $10^{-3}$ A/cm$^2$ for a single domain dielectric. As mentioned above, subjecting the grown dielectric to a post-forming gas anneal (a combination of $N_2$ and $H_2$) will further improve (that is, decrease) the leakage current density. As shown in FIG. 4, the forming gas anneal on the single domain 34 Å film results in further improving the leakage current density to a value of about $10^{-5}$ A/cm$^2$.

Figure 5:
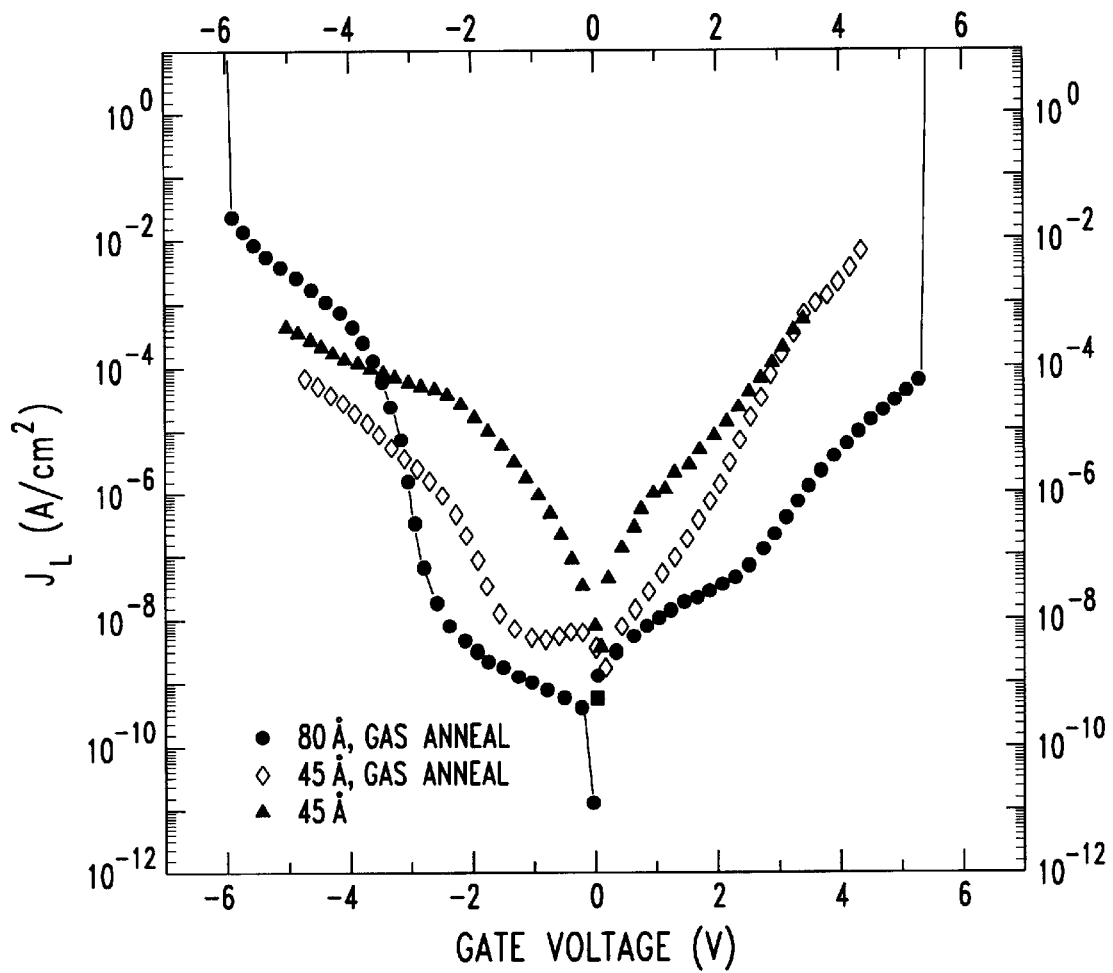
FIG. 5 is a graph of leakage current density versus voltage for amorphous $Y_2O_3$ films.

A study of amorphous dielectric films suggests that these films may be more appropriate for device applications than crystalline films, due to the absence of domain boundaries and the lack of surface or interfacial stress in the latter. Additionally, while the leakage currents of amorphous $Gd_2O_3$ films are comparable to the amorphous $Y_2O_3$ films, $Y_2O_3$ shows a more consistent dielectric behavior than $Gd_2O_3$, in that the dielectric constant of $Y_2O_3$ remains essentially constant at about 18, insensitive to thickness reductions. FIG. 5 shows the dependence of $J_L$ on V for a series of amorphous $Y_2O_3$ films. As shown, an as-deposited amorphous $Y_2O_3$ film 45 Å thick yields a relatively low leakage current density of $10^{-6}$ A/cm² at 1V for an equivalent $SiO_2$ thickness ("$t_{eq}$") of only 10 Å. The leakage current density improves by another order of magnitude after a forming gas anneal (at a temperature of, for example, 400° C. for about one hour). The resulting value is about five orders of magnitude better than the best data associated with conventional 15 Å thick $SiO_2$ dielectrics. Beyond this leakage current density, performing a rapid thermal anneal (RTA) at 1000° C. for about one minute shows that the $Y_2O_3$ film remains essentially stable.

Figure 6:
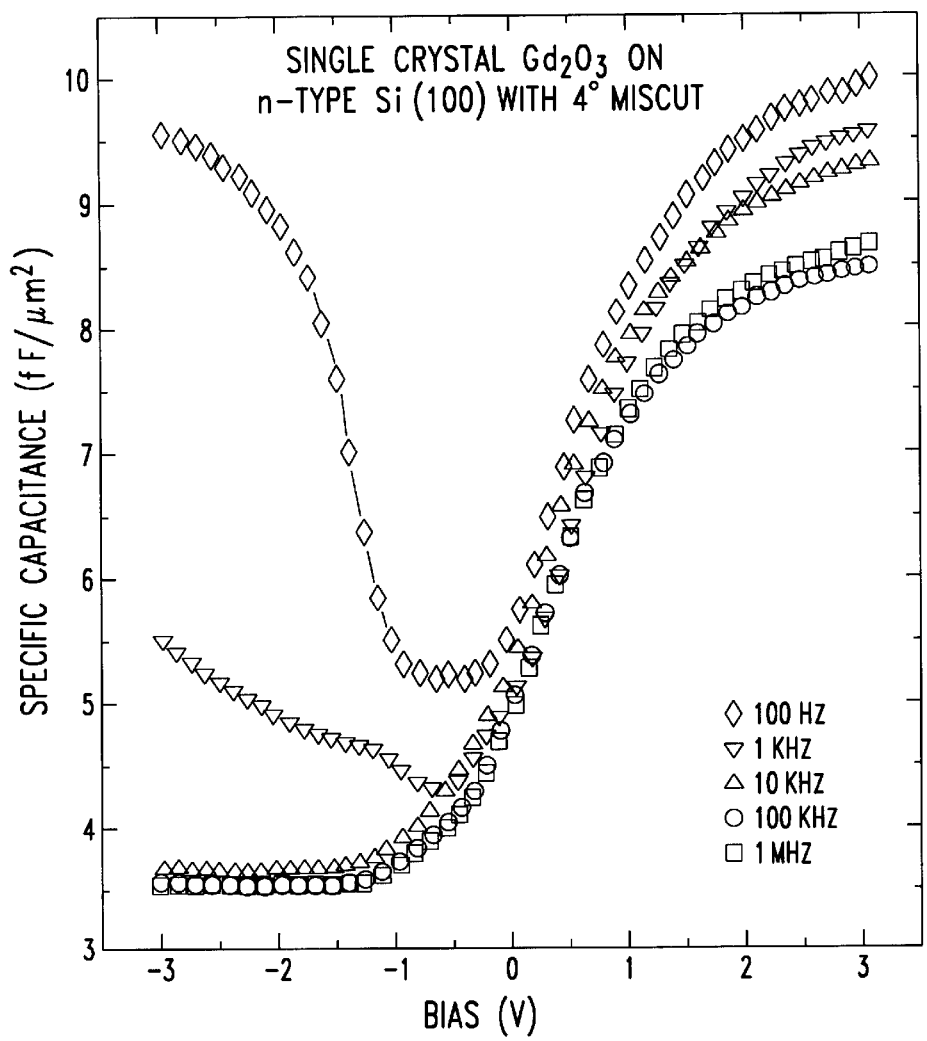
FIG. 6 illustrates specific capacitance as a function of voltage for single crystal $Gd_2O_3$ grown on a vicinal silicon substrate.
Figure 7:
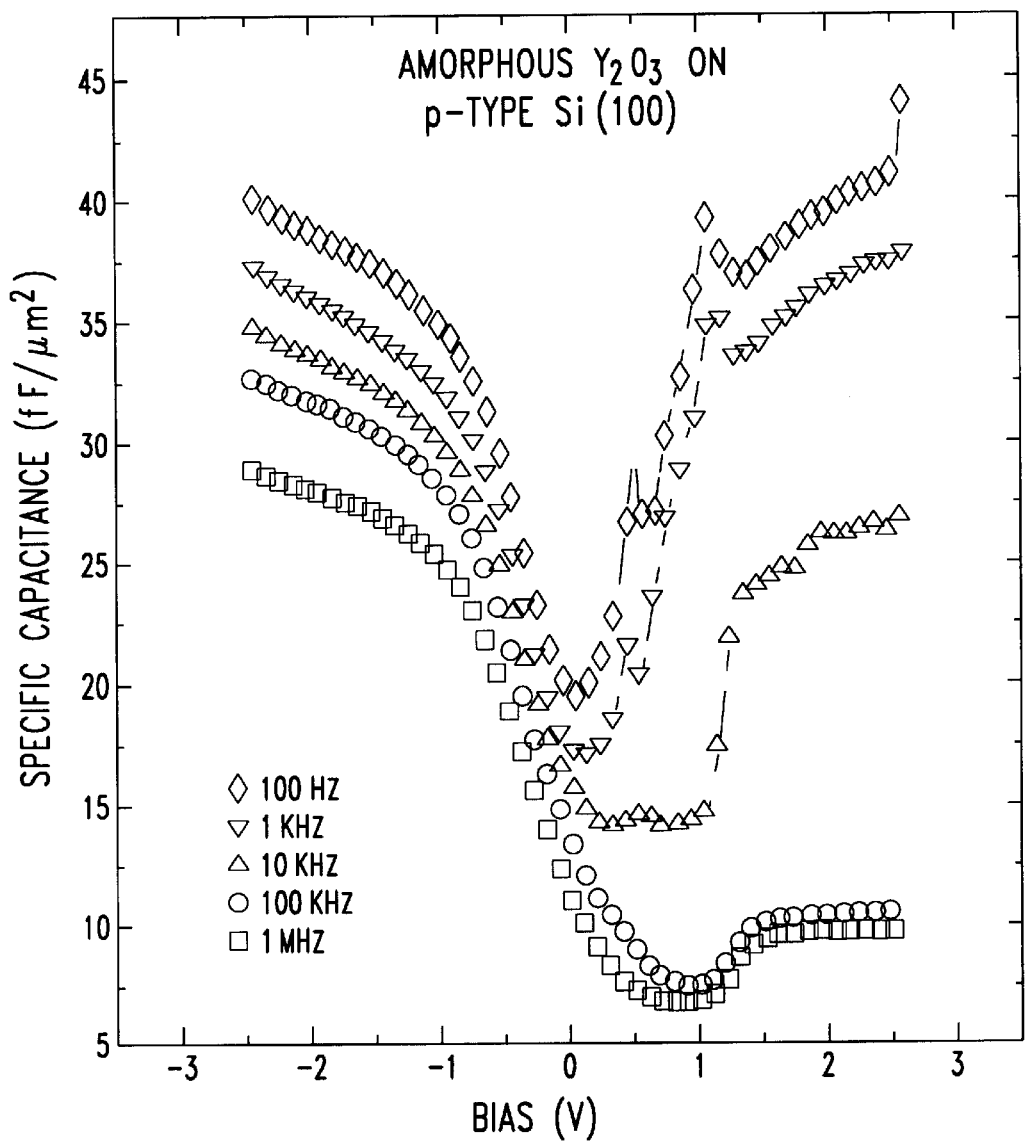
FIG. 7 illustrates specific capacitance as a function of voltage for amorphous $Y_2O_3$ grown on a conventional silicon substrate.

The specific capacitance (C/A) versus voltage data for an MOS diode including a $Gd_2O_3$ single domain, 196 Å thick gate dielectric (after a forming gas anneal) is shown in FIG. 6 as a function of frequency ranging from 100 Hz to 1 MHz. The dielectric constant ($\in$) for such a film was measured to exhibit a value of approximately 20. As shown, a transition in MOS diode behavior from accumulation to depletion mode occurs at approximately 2V. the inversions of the carriers (holes) is evident, and follows the AC signal up to a frequency of 10 kHz. FIG. 7 illustrates the C/A versus V data for a 45 Å thick amorphous $Y_2O_3$ film (after g a post-growth forming gas anneal). The capacitor has a C/A value as high as 35–40 fF/$\mu$m², comparable to a 10 Å thick $SiO_2$ equivalent (or better). It is to be noted that the dielectric constant associated with this material remains at a value of 18 even at this thin layer.

The invention has been described with reference to particular preferred embodiments, but variations within the spirit and scope of the invention will occur to those skilled in the art. For example, while $Gd_2O_3$ and $Y_2O_3$ have been discussed in detail, various other rare earth oxides of the form $Mn_2O_3$, in both single crystal and amorphous form, may also be used to create high dielectric gate oxides in accordance with the principles of the present invention.

What is claimed is:

1. A semiconductor device comprising:
   a vicinal silicon (100) substrate exhibiting a predetermined angular miscut so as to form a top major surface including surface steps of double atomic layers along the [011] direction, yielding mono-domain silicon terraces suitable for nucleating growth; and
   a rare earth oxide film of the form $Mn_2O_3$, exhibiting a dielectric constant $\in\geq 4$ and deposited under an oxygen partial pressure less than $10^{-7}$ torr, to a predetermined thickness t on the mono-domain silicon terraces of said vicinal silicon substrate, without forming an $SiO_2$ layer therebetween.

2. A semiconductor device as defined in claim 1 wherein the rare earth oxide comprises $Gd_2O_3$.

3. A semiconductor device as defined in claim 2 wherein the $Gd_2O_3$ comprises epitaxial $Gd_2O_3$.

4. A semiconductor device as defined in claim 2 wherein the rare earth oxide comprises a two-domain (100) $Gd_2O_3$ structure.

5. A semiconductor device as defined in claim 2 wherein the rare earth oxide comprises a single domain (100) $Gd_2O_3$ structure.

6. A semiconductor device as defined in claim 1 wherein the rare earth oxide comprises $Y_2O_3$.

7. A semiconductor device as defined in claim 6 wherein the $Y_2O_3$ comprises epitaxial $Y_2O_3$.

8. A semiconductor device as defined in claim 6 wherein the rare earth oxide comprises a two-domain (100) $Y_2O_3$ structure.

9. A semiconductor device as defined in claim 6 wherein the rare earth oxide comprises a single domain (100) $Y_2O_3$ structure.

10. A semiconductor device as defined in claim 1 wherein the rare earth oxide is formed to comprise a thickness in the range of 10 Å to 500 Å.

11. A semiconductor device as defined in claim 1 wherein the vicinal silicon substrate comprises a predetermined angular miscut in the range of 4–6°.

12. A semiconductor device as defined in claim 11 wherein the predetermined angular miscut is approximately 4°, forming a terrace spacing on the silicon substrate major surface of approximately 80 Å.

13. A semiconductor device comprising
   a silicon substrate defined as comprising a top major surface; and
   an amorphous rare earth oxide of the form $Mn_2O_3$ and exhibiting a dielectric constant $\in\geq 4$ deposited, under an oxygen partial pressure less than $10^{-7}$ torr to a predetermined thickness t on the top major surface of the silicon substrate without forming an $SiO_2$ film therebetween.

14. A semiconductor device as defined in claim 13 wherein the amorphous rare earth oxide comprises $Gd_2O_3$.

15. A semiconductor device as defined in claim 13 wherein the amorphous rare earth oxide comprises $Y_2O_3$.

* * * * *